United States Patent
Davila et al.

(10) Patent No.: US 10,396,776 B2
(45) Date of Patent: Aug. 27, 2019

(54) DRIVE VOLTAGE BOOSTER

(71) Applicant: Apple Inc., Cupertino, CA (US)

(72) Inventors: Marco A. Davila, Austin, TX (US); Bogdan T. Bucheru, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/878,020

(22) Filed: Jan. 23, 2018

(65) Prior Publication Data

US 2019/0007040 A1 Jan. 3, 2019

Related U.S. Application Data

(60) Provisional application No. 62/526,518, filed on Jun. 29, 2017.

(51) Int. Cl.

| | |
|---|---|
| G05F 1/10 | (2006.01) |
| G05F 1/40 | (2006.01) |
| H02M 3/07 | (2006.01) |
| H03K 17/16 | (2006.01) |
| H02M 1/08 | (2006.01) |
| H02M 3/156 | (2006.01) |
| H02M 1/00 | (2006.01) |

(52) U.S. Cl.
CPC ............ *H03K 17/161* (2013.01); *H02M 1/08* (2013.01); *H03K 17/162* (2013.01); *H03K 17/165* (2013.01); *H02M 3/07* (2013.01); *H02M 3/156* (2013.01); *H02M 2001/0058* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,556,064 B1 * | 4/2003 | Yatabe | .................... | H02M 3/07 307/110 |
| 7,612,603 B1 * | 11/2009 | Petricek | .................. | H02M 3/07 307/109 |
| 9,369,038 B2 * | 6/2016 | Sakai | .................... | H02M 3/156 |

* cited by examiner

*Primary Examiner* — An T Luu
(74) *Attorney, Agent, or Firm* — Blank Rome LLP

(57) ABSTRACT

This disclosure describes a gate driver with voltage boosting capabilities. In some embodiments, the gate driver may comprise a charge pump that includes capacitor(s) and switch(es). Responsive a logic low input signal, the gate driver may bypass the capacitor(s) to allow the input digital signal to drive the gating signal directly. Conversely, responsive to a logic high input signal, the gate driver may couple the capacitor(s) in series with the input digital signal to generate a boosted gating signal. In some embodiments, the gate driver may comprise an inductor-capacitor resonant circuit to create a doubled output gating signal with respect to the input digital signal. In some embodiments, the resonant gate driver may include an additional voltage boosting capability that can be selectively enabled to compensate for a voltage drop during the signal transfer from the input to the output.

19 Claims, 4 Drawing Sheets

DRIVE VOLTAGE BOOSTER

TECHNICAL FIELD

This disclosure relates generally to the field of power converters and, in particular, to gate drivers used to drive power electronic devices.

BACKGROUND

Generally, a power converter contains power electronic devices, for example, metal oxide semiconductor field-effect transistors (MOSFETs) or insulated gate bipolar transistors (IGBTs), and one or more controllers. The power electronic devices function as controlled switches, while the controllers produce the required control signals. A gate driver is an interface electronic circuit between a power electronic device and a controller. The gate driver may accept a logic input (i.e., an input digital signal) from the controller and correspondingly produce an output to drive the gate of the power electronic device (i.e., an output gating signal). The gate driver may fulfill several purposes, one of which is voltage shifting. In practice, the voltage level of the controller's digital signal may be different from what is required to drive the power electronic device. For example, MOSFETs generally require gate voltages more than 6V, while many controllers produce digital outputs at 1.8, 3.3, or 5V. Therefore, the gate driver may serve as a voltage shifter or booster to match different voltage levels between controller(s) and power electronic devices.

A gate driver may employ multiple bias voltages to implement the level shifting. For example, the gate driver may use a first 5V bias voltage to interface with a controller, and a second 10V bias voltage to provide a gating signal for a power electronic device. Alternatively, the controller itself may include a first bias voltage to bring its digital outputs to a voltage level compatible with the gate driver, while the gate driver may use a second bias voltage to provide an appropriate gating signal for the power electronic device. Nonetheless, the power converter, as a whole, may still have to employ multiple bias voltages to accommodate the voltage requirements of different components. These individual bias voltages have typically been provided by separate, dedicated power supply circuits. All this may create a design complexity, which may impact the power converter's reliability, cost, packaging, and efficiency. Therefore, what is needed is a gate driver with simplified requirements for bias voltages but still capable of providing voltage boosting.

SUMMARY

This disclosure describes a gate driver with voltage boosting capabilities. In some embodiments, the gate driver may comprise a voltage boosting circuit based on charge pump, which may comprise capacitor(s) and switch(es). The gate driver may receive an input digital signal from a controller and produce an output gating signal to drive a power electronic device. When the input digital signal is at logic low, the gate driver may bypass the capacitor(s) of the charge pump and allow the input digital signal to drive the gating signal directly. By doing this, the input digital signal may create the output gating signal with minimal time delay and signal losses. Conversely, when the input digital signal is asserted to logic high, the capacitor(s) of the charge pump may become in series with the input digital signal, thus adding a voltage (from the charge pump) to the input digital signal and generating a boosted gating signal.

Depending on the application, the charge pump voltage may be selected to be close to or different from the logic high voltage of the input digital signal.

In some embodiments, the charge pump voltage may be equivalent or close to the logic high voltage of the input digital signal, and the resultant gating signal may be doubled with respect to the input digital signal.

In some embodiments, the charge pump voltage may be different from the logic high voltage of the input digital signal, and the resultant gating signal may be boosted instead of doubled with respect to the input digital signal.

In some embodiments, the gate driver may include a primary side and a secondary side, the two of which are isolated, for instance, by a transformer. The disclosed gate driver circuit, especially the circuit related to voltage boosting, may be used at either or both of the primary and secondary sides. Herein, the primary side refers to the portion of a gate driver that interfaces directly with the controller, while the secondary side designates the portion that works directly with the power electronic device. The isolation may provide a barrier to electromagnetic interference (EMI) propagation from the secondary side to the primary side, as well as further flexibility to match the different voltages.

In some embodiments, the gate driver may comprise an inductor-capacitor resonant circuit. The resonant circuit may cause a doubled output gating signal with respect to the input digital signal.

In some embodiments, the resonant gate driver may include an additional voltage boosting capability. This voltage boosting capability may be enabled or disabled based on setting of a time delay. By utilizing the time delay, the gate driver may create an operating condition wherein an inductor and a switch may form a booster converter to further increase the output gating signal. This may compensate for a voltage drop during the signal transfer from the input to the output.

BRIEF DESCRIPTION OF THE DRAWINGS

Various embodiments of the disclosed concepts are illustrated by way of example and not by way of limitation in the accompanying drawings in which like references indicate similar elements. It should be noted that references to "an", "one" or "another" embodiment in this disclosure are not necessarily to the same or different embodiment, and they mean at least one. In order to be concise, a given figure may be used to illustrate the features of more than one embodiment, or more than one species of the disclosure, and not all elements in the figure may be required for a given embodiment or species. Additionally, features from multiple figures may be combined in some embodiments.

DETAILED DESCRIPTION

In the following description, for purposes of explanation, numerous specific details are set forth in order to provide a thorough understanding of the disclosed concepts. As part of this description, some of this disclosure's drawings represent structures and devices in block diagram form in order to avoid obscuring the disclosure. In the interest of clarity, not all features of an actual implementation are described in this disclosure. Moreover, the language used in this disclosure has been principally selected for readability and instructional purposes, and may not have been selected to delineate or circumscribe the disclosed subject matter, resort to the claims being necessary to determine such disclosed subject matter.

Figure 1:
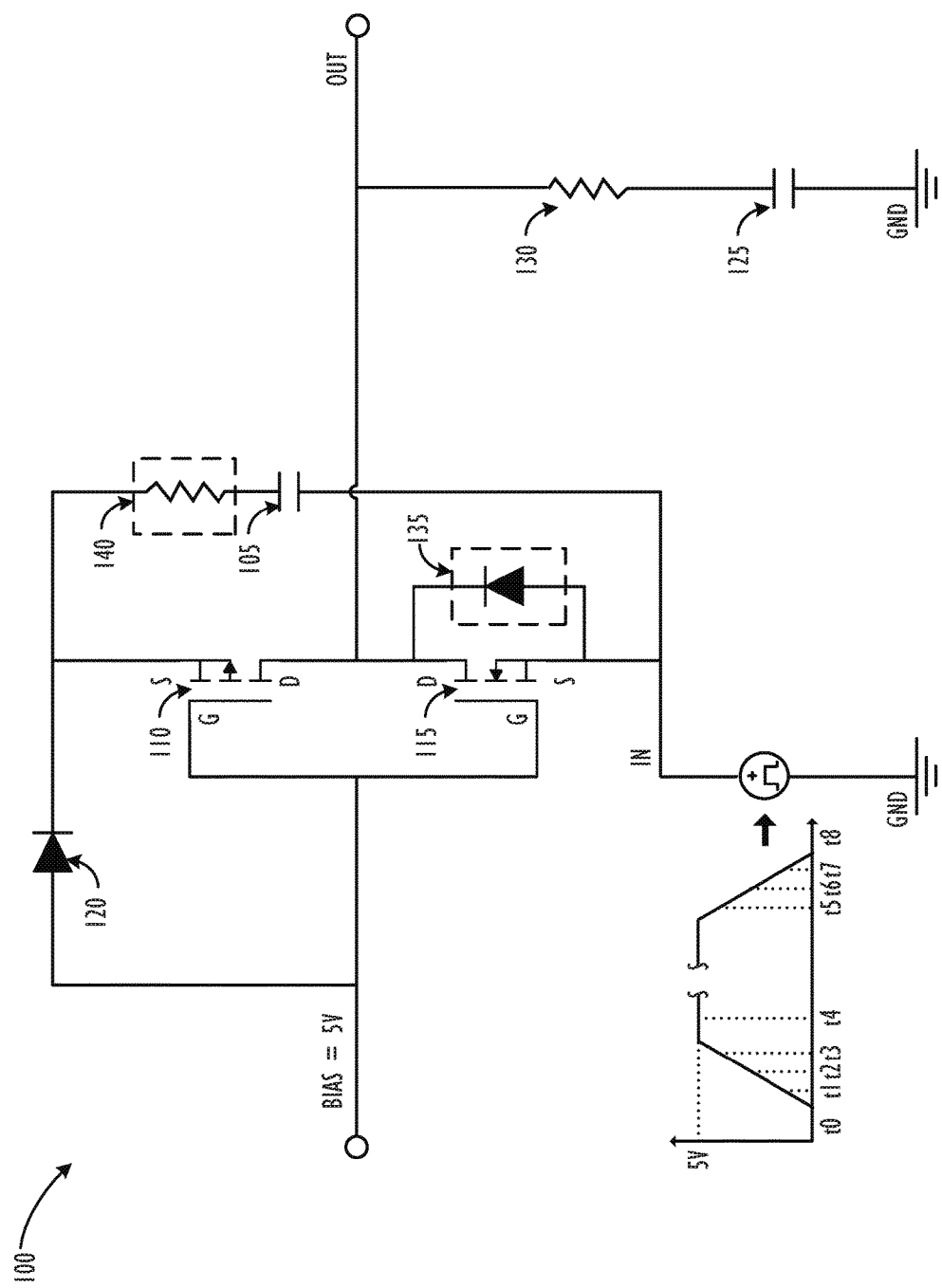
FIG. 1 is a schematic diagram illustrating exemplary gate driver 100, wherein a charge pump voltage of the gate driver is equivalent or close to the logic high voltage of an input digital signal, according to some embodiments.

FIG. 1 illustrates exemplary gate driver 100 in accordance with some embodiments. As shown in FIG. 1, gate driver 100 may receive an input digital signal ("IN") from a controller and then generate an output gating signal ("OUT") to drive a power electronic device. Gate driver 100 may be supplied by a bias voltage ("BIAS"). The bias voltage may be selected equivalent or close to the logic high voltage of the input digital signal, thereby both of which may ultimately be derived from the same power supply. For example, both the bias voltage and the logic high voltage of the input digital signal may be 5V as shown in FIG. 1.

Gate driver 100 may comprise a charge pump made up of capacitor 105 and two switches 110 and 115. For illustrative purposes only, one switch is a p-channel MOSFET (pFET) 110 and the other is an n-channel MOSFET (nFET) 115 in FIG. 1. In practice, the two switches are not limited to MOSFETs and may be implemented using other types of semiconductor devices, such as field-effect transistors (FETs), bipolar junction transistors (BJTs), junction field-effect transistors (JFETs), insulated gate bipolar transistors (IGBTs), etc. Further, to facilitate explanations, the corresponding gate, source and drain terminals of pFET 110 and nFET 115 are labeled as "G", "S" and "D" in FIG. 1. In FIG. 1, pFET 110 may be connected in series with nFET 115, wherein the source terminal of pFET 110 may be coupled to the bias voltage through diode 120; the source terminal of nFET 115 may be tied to the input digital signal (represented by a pulse voltage source); and the middle point between pFET 110 and nFET 115 may be used to generate the output gating signal. The gate terminals of pFET 110 and nFET 115 may be tied together to the bias voltage. Capacitor 105 may be connected across pFET 110 and nFET 115 to the respective source terminals of the two switches. The gate of the exterior power electronic device (not shown) may be modeled as gate capacitor 125 in series with resistor 130. The change of the output gating signal may be modeled as the charging and discharging of gate capacitor 125.

Note that gate driver 100 may include some other components, such as resistors, capacitors, inductors, and/or diodes, which are typical for power electronic devices' gate drivers and not necessarily specific to embodiments in this disclosure. These components may be used for general purposes such as current limiting and/or voltage stabilization. Because these components are not the focus of the discussions of this disclosure, they are omitted from the drawings.

pFET 110 and nFET 115 may be controlled by, for instance, their respective gate-to-source voltages (Vgs). In particular, pFET 110 may be closed with a sufficient negative Vgs(110), while nFET 115 may be closed with a sufficient positive Vgs(115). For illustrative purposes only, it is assumed herein that the threshold voltage of pFET 110 is −3V and the threshold voltage of nFET 115 is 3V. Therefore, pFET 110 may be turned on when Vgs(110) is less than −3V (i.e., Vgs(110)<−3V), while nFET 115 may be closed when Vgs(115) is more than 3V (Vgs(115)>3V).

To illustrate operations of gate driver 100, the lower left portion of FIG. 1 depicts a waveform of the input digital signal that may increase from zero (corresponding to logic low) to 5V (corresponding to logic high) and then back to zero volts. The waveform contains slopes to represent the transitions between logic high and logic low. The generation of the output gating signal from the input digital signal will be discussed along different time instances in the following.

At time t0, the input digital signal starts at logic low and at zero volt. Consider nFET 115, given the above numerical values, its gate-to-source voltage Vgs(115) may be 5V, which is larger than 3V (i.e., the threshold voltage of nFET 115). Thus, nFET 115 may be closed, and the input digital signal may drive the output gating signal directly (i.e., both signals are logic low at zero volts). As for pFET 110, the gate-to-source voltage Vgs(110) may equal to a voltage drop across diode 120, for instance, 0.5V, that is higher than −3V (the threshold voltage of pFET 110). Therefore, pFET 110 may remain off. Further, the bias voltage may charge capacitor 105 and cause the charge pump voltage (i.e., the voltage of capacitor 105) to reach approximately the bias voltage minus diode 120's voltage drop (i.e., 5−0.5=4.5V). In summary, at time t0, pFET 110 may be open, capacitor 105 may be charged to a voltage close to the bias voltage, nFET 115 may be closed, thus bypassing capacitor 105 and allowing the input digital signal to drive the output gating signal directly.

After the input digital signal is asserted high, the input digital signal may transition from logic low to logic high, as illustrated by the increasing slope in the waveform in FIG. 1. At time t1, the input digital signal may be assumed to reach 1V. nFET 115 may remain closed because its gate-to-source voltage Vgs(115) may equal to 4V (i.e., 5V−1V=4V), still larger than the 3V threshold voltage of nFET 115. Therefore, nFET 115 may continuously bypass capacitor 105 of the charge pump, and the input digital signal may continuously drive the output gating signal directly (e.g., charging gate capacitor 125). This may reduce time delay and/or voltage losses between the input and output signals. On the other hand, as the input digital signal increases, the cathode potential of diode 120 may rise accordingly because this cathode potential equals to the voltage of capacitor 105 plus the input digital signal voltage. When the input digital signal reaches 1V, the cathode potential of diode 120 may reach 5.5V (i.e., 4.5+1=5.5V), assuming that capacitor 105's voltage (e.g., 4.5V) does not change substantially during the transition. Thus, diode 120 may become reverse-biased, e.g., by −0.5V (i.e., 5−5.5=−0.5V), turn off and block the discharging of capacitor 105. The gate-to-source voltage of pFET 110 Vgs(110) may also become negative such as −0.5V, but still higher than the −3V threshold voltage of pFET 110. Thus, pFET 110 may remain off. In summary, at time t1, pFET 110 may be open, nFET 115 may be closed, diode 120 may stay off, capacitor 105 may stay being bypassed, and the input digital signal may continue driving the output gating signal directly.

At time t2, the input digital signal may continuously increase to 2V. The gate-to-source voltage Vgs(115) of nFET 115 may now become 3V (i.e., 5−2=3V), which equals to the 3V threshold voltage of nFET 115. Thus, nFET 115 may be turned off. However, the input digital signal may still directly drive the gating signal through the body diode of nFET 115 (not shown in FIG. 1). Alternatively, gate driver 110 may use an optional low conduction voltage diode, such as Schottky diode 135, connected in parallel with nFET 115 to reduce conduction losses. Additionally, similar to the scenario at time t1, as the input digital signal increases, the source potential of pFET 110 (which is also the cathode potential of diode 120) may rise as well. Therefore, diode 120 may remain reverse-biased, and the gate-to-source voltage Vgs(110) may become even further negative, for instance, −1.5V (i.e., 5−(2+4.5)=−1.5V). Again, it is assumed that capacitor 105's voltage (e.g., 4.5V) does not change substantially during the transition of the input digital signal. This may be achieved by choosing an appropriate capacitance for capacitor 105. Since the gate-to-source voltage Vgs(110) of pFET 110 is still higher than the −3V threshold voltage, pFET 110 may remain off. In summary, at time t2, both pFET 110 and nFET 115 may be open, diode 120 may remain off, and the input digital signal may continuously directly drive the output gating signal.

At time t3, the input digital signal may continuously rise to 4V. The gate-to-source voltage Vgs(115) of nFET 115 may become 1V (i.e., 5−4=1V), which is less than the 3V exemplary threshold voltage of nFET 115. Thus, nFET 115 may remain off. Additionally, the gate-to-source voltage Vgs(110) may now reach −3.5V (i.e., 5−(4+4.5)=−3.5V), which is lower than the −3V threshold voltage of pFET 110. Thus, pFET 110 may be turned on. Accordingly, capacitor 105 may now become in series with input digital signal, thus adding a voltage (from capacitor 105) to the input digital signal and creating a boosted gating signal. In summary, at time t3, pFET 110 may be closed, nFET 115 may be open, diode 120 may remain off, and capacitor 105 may become in series with the input digital signal and thus result in a boosted gating signal.

Note that, depending on selections of pFET 110 and nFET 115 (e.g., selecting threshold voltages of the switches), pFET 110 may be turned on before nFET 115 is turned off. Since the input digital signal continue increasing, nFET 115 may be turned off anyway and result into the same scenario described at time t3. To avoid an over-current through capacitor 105 during the concurrent conduction of pFET 110 and nFET 115, gate driver 100 may include optional resistor 140 in series with capacitor 105 as a current-limiting component.

At time t4, the input digital signal may finish the transition and reach the steady-state logic high level, for instance, 5V. Similarly as time t3, pFET 110 may remain closed, nFET 115 may stay open, diode 120 may remain off, and capacitor 105 may stay in series with the input digital signal and thus result in a doubled (e.g., 10V) gating signal with respect to the input digital signal.

After the input digital signal is asserted low, the input digital signal may move into the next transition and start to decline. At time t5, the input digital signal may reach 4V. Similar to the scenario at time t3, pFET 110 may be closed, nFET 115 may be open, diode 120 may remain off, capacitor 105 may continuously remain in series with the input digital signal, and the two together may create a boosted gating signal.

At time t6, the input digital signal may continuously decline to 2V. Similarly as time t2, pFET 110 may be turned off and thus disconnect capacitor 105 from the input digital signal. Once the input digital signal drops below 2V, nFET 115 may turn on with a gate-to-source voltage Vgs(115) of more than 3V (i.e., 5−2=3V), and the digital signal may directly drive the output signal. At the moment when nFET 115 turns on, the input digital signal may quickly discharge the gating signal to the same level as the input digital signal.

Note that, depending on selections of pFET 110 and nFET 115 (e.g., selecting threshold voltages of the switches), nFET 115 may be turned on before pFET 110 is turned off. Since the input digital signal continue decreasing, pFET 110 may be turned off anyway and result into the same scenario described at time t6. Again, optional resistor 140 may be used to limit the current flowing through capacitor 105 during the concurrent conduction of pFET 110 and nFET 115.

At time t7, the input digital signal may continuously decrease to 1V. Similar to the scenario at time t1, nFET 115 may turn on and pFET 110 may remain off. Thus, the gate signal may be driven directly by the input digital signal through nFET 115. Again, depending on the selection of pFET 110 and nFET 115, there may be a condition where both pFET 110 and nFET 115 remain open. Since the body diode of the nFET 115 (not shown) or optional parallel diode 135 may not conduct current in an opposite direction, the gating signal may be fixed (i.e., remain at a fixed voltage). With the falling of the input digital signal, there will be a point where nFET 115 may be closed, which may quickly discharge the gating signal to the same level at the input digital signal and result into the same scenario described at time t7.

At time t8, the input digital signal may finish the transition and reach the steady-state logic low level, such as zero volts. Referring to the analysis at time t0, the input digital signal may directly drive the gating signal to zero as well. Meanwhile, diode 120 may again become forward-biased and allow the bias voltage to recharge capacitor 105 to recover any lost charge during both transitions.

Note that diode 120 may be a Schottky diode or a PN-junction diode, for instance, depending on the bias voltage and selections of FETs 110 and/or 115. Further, additional components such as resistor(s) and/or inductor(s) may be included in series with diode 120 to further control the voltage of capacitor 105. When inductor(s) are used, they together with capacitor 105 may form a resonant circuit that can charge the charge pump with lower losses and higher efficiency. Additionally, it should be understood that in practice components of gate driver 100 may cause voltage drops and signal losses, and therefore the output gating signal may not be exactly twice the value of the input digital signal. The words "double" and/or "doubler" are used herein mainly to facilitate an understanding of the operational principles of the gate driver.

Figure 2:
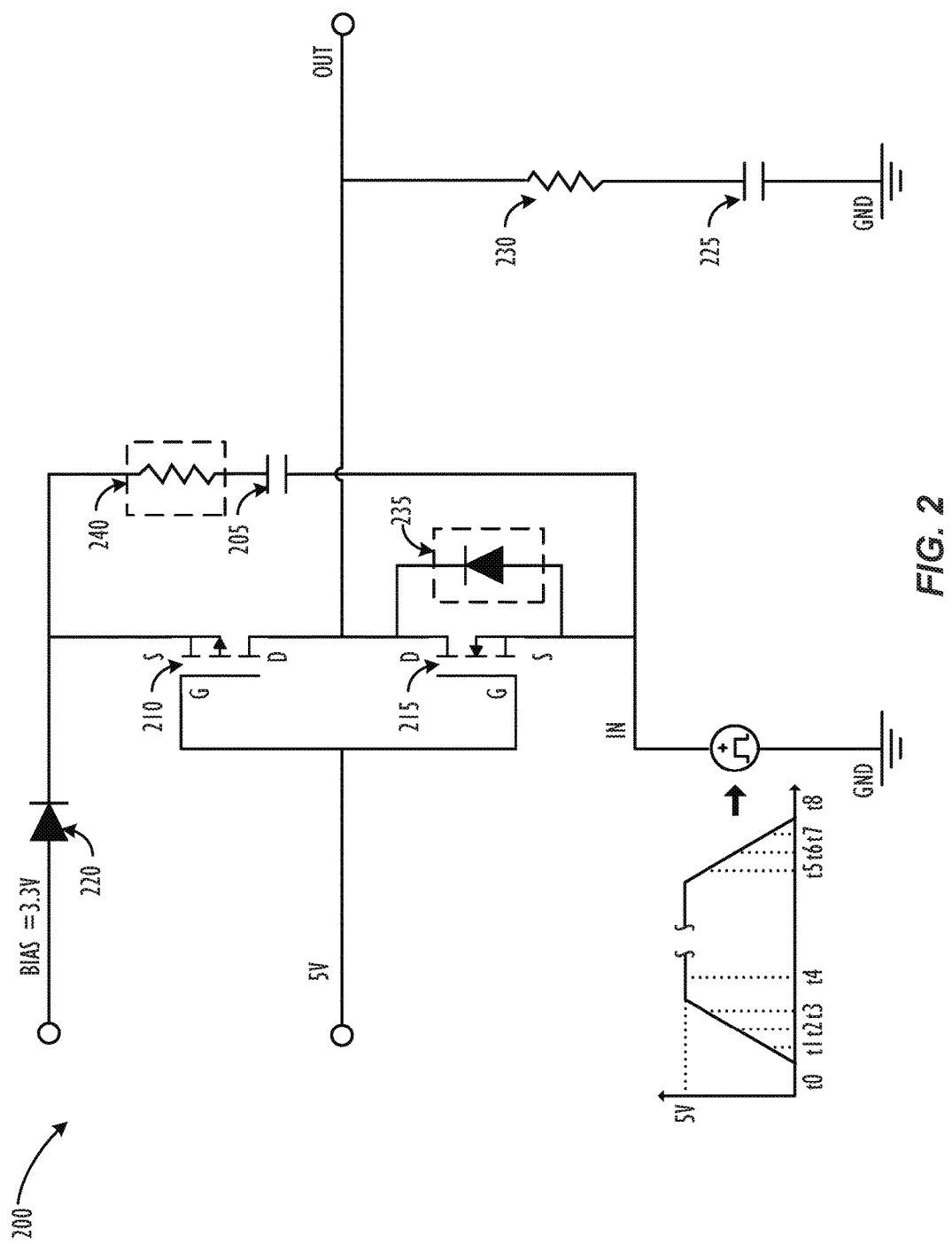
FIG. 2 is a schematic diagram illustrating exemplary gate driver 200, wherein a charge pump voltage of the gate driver is different from the logic high voltage of an input digital signal, according to some embodiments.

FIG. 2 illustrate exemplary gate driver 200, wherein the charge pump voltage may be different from the logic high voltage of an input digital signal, according to some embodiments. Gate driver 200 may have a substantially similar configurations as gate driver 100 in FIG. 1, except that the voltage used to charge the capacitor of the charge pump (e.g., 3.3V) may be different from the logic high voltage of the input digital signal (e.g., 5V). Because of the difference, when the capacitor is connected in series with the input digital signal, the resultant output gating signal may be still boosted, just not doubled, with respect to the input digital single. This allows for more flexibility to obtain a boosted gating signal based on the need of applications.

Since the two gate drivers 100 and 200 share substantially similar configurations, operations of gate driver 200 may also be discussed along different time instances, with reference to the descriptions in FIG. 1. For example, at time t0, given the same numerical values as used in FIG. 1, pFET 210 may be open, capacitor 205 of gate driver 200's charge pump may be charged to a voltage close to the bias voltage (e.g., 3.3−0.5=2.8V), nFET 215 may be closed, thus bypassing capacitor 205 and allow the input digital signal to directly drive the gating signal to zero volt.

The status of pFET 210 and nFET 215 may remain the same until time t2. At time t2, nFET 215 may be turned off, pFET 210 may remain open and bypass capacitor 205, and the input digital signal may directly drives the gating signal through the body diode of nFET 215 (not shown) or optional diode 235.

At time t3, as described in FIG. 1, pFET 210 may be closed, nFET 215 may remain open, and capacitor 205 may become in series with the input digital signal and thus result in a boosted gating signal.

The status of pFET 210 and nFET 215 may remain unchanged while the input digital signal reaches the steady-state logic high level, such as 5V. Note that since capacitor 205's voltage is different from the logic high voltage of the input digital signal, the resultant gating signal may be boosted, but not doubled, with respect to the input digital signal.

When the input digital signal is asserted low, gate driver 200 may repeat the operations as described at time t0-t3 but in an opposite sequence, except that optional parallel diode 235 or the body diode of nFET 215 (not shown) may not discharge the gating signal by conducting current in an opposite direction. For example, when the input digital signal declines to 2V at time t6, pFET 210 may be turned off, and capacitor 205 may be disconnected from the input digital signal. Since nFET 215 may stay off, the gating signal may remain at a fixed voltage until the input digital signal falls to a level that may turn on nFET 215 at t7. Since the body diode of nFET 215 or optional parallel diode 235 may not conduct current in the opposite direction, the gating signal may stay at the fixed voltage.

At time t7, the input digital signal may continuously decrease to 1V. Similarly as time t1, nFET 215 may be turned on, and pFET 210 may remain off. Thus, the gate signal may be driven directly by the input digital signal through nFET 215. At the moment when nFET 215 turns on, the input digital signal may quickly discharge the gate signal to the same level as the input digital signal.

Finally, at time t8, the input digital signal may finish the transition and reach the steady-state logic low level of zero volt, the input digital signal will bring the output gating signal to zero again. Diode 220 may become forward-biased again and allow capacitor 205 to be recharged, for example, to 2.8V.

Figure 3:
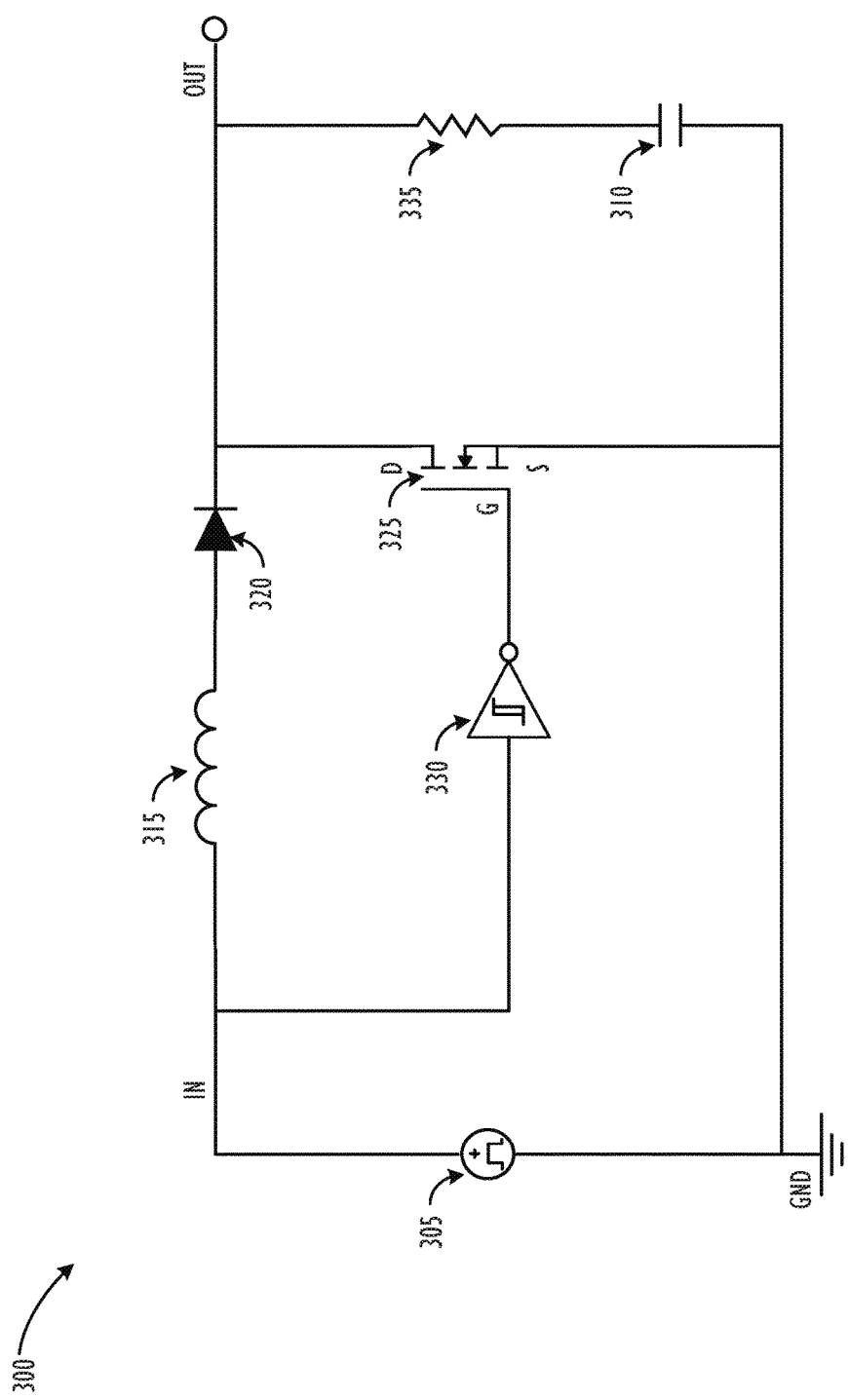
FIG. 3 is a schematic diagram illustrating exemplary gate driver 300 that includes a resonant circuit with an additional voltage boosting capability, in accordance with some embodiments.

FIG. 3 illustrates exemplary gate driver 300 using a resonant circuit with an additional voltage boosting capability, in accordance with some embodiments. As shown in FIG. 3, gate driver 300 may receive an input digital signal ("IN"), represented by pulse voltage source 305, and generate an output gating signal ("OUT"). The gate of the exterior power electronic device (not shown) may be modeled as gate capacitor 310 in series with resistor 335. Resistor 335 may limit the discharging and/or charging current of gate capacitor 310. Gate capacitor 310 may be connected in series with inductor 315 through diode 320. Gate capacitor 310 and inductor 315 may form a resonant inductor-capacitor circuit. Gate driver 300 may further include a switch, e.g., nFET 325, which may be coupled in parallel with gate capacitor 310. nFET 325 may be driven by the input digital signal through inverter (i.e., NOT gate) 330, as shown in FIG. 3. Inverter 300 may further include an additional time delay, and the time delay may be predetermined or adjustable during operations.

Referring to FIG. 3, when the input digital signal is asserted high, pulse voltage source 305 may generate a logic high voltage. Pulse voltage source 305 may charge gate capacitor 310 via inductor 315. The inductor-capacitor resonant circuit may cause an output gating signal equal to:

$$v_{OUT}=v_{IN}\times(1-\cos \omega t) \quad (1)$$

where $V_{IN}$, $V_{OUT}$ and ω in equation (1) represent the voltage of the input digital signal, the voltage of the output gating signal, and the angular frequency of the resonant circuit. Therefore, gate driver 300 may obtain a gating signal with a voltage equal to twice the voltage of the input digital signal when, for instance, (ωt) equal to 180 degrees. When the gating signal reaches the boosted value, diode 320 may become reverse-biased, block a discharging current flowing through gate capacitor 310, and thus clamp the gating signal voltage at the boosted level. In summary, when the input digital signal is asserted high, the output gating signal may also be asserted high with a boosted value with respect to the input digital signal.

Referring back to FIG. 3, when the input digital signal is asserted low, pulse voltage source 305 may generate a logic low voltage that may, through inverter 330, create a turn-on signal for nFET 325. When nFET 325 is closed, gate capacitor 310 may be discharged. Accordingly, the output gating signal may be asserted low as well (i.e., following the input digital signal). In summary, when the input digital signal is asserted low, the output gating signal may be driven low as well.

In practice, the components in gate driver 300, e.g., inductor 315, may include certain resistance (not shown in FIG. 3). They may cause a voltage drop between the input and output signals. In other words, the output gating signal created by the resonant circuit may not equal to exactly the doubled value of the input digital signal. To compensate for the losses, gate driver 300 may provide an additional voltage boosting capability by utilizing the time delay of inverter 330. With the time delay, gate driver 300 may create an "overlapping" period that allows inductor 315 and nFET 325 to function as a boost converter. For example, when input digital signal transitions from logic low to logic high, pulse voltage source 305 may generate a logic high voltage, while nFET 325 may still remain closed because of the time delay in inverter 330. Thus, pulse voltage source 305 may charge inductor 315 through nFET 330. When the time delay expires, nFET 325 may be turned off, and then pulse voltage source 305 and inductor 315, together, may charge gate capacitor 310. By adding a voltage from inductor 315 to pulse voltage source 305, gate driver 300 may further boost the generated gating signal voltage with respect to the input digital signal. As aforementioned, the time delay of inverter 330 may be predetermined or adjustable during operations, depending on the needs of applications. Optionally, when the time delay is set or adjusted to zero, the additional voltage boosting capability of gate driver 300 may be disabled.

Figure 4:
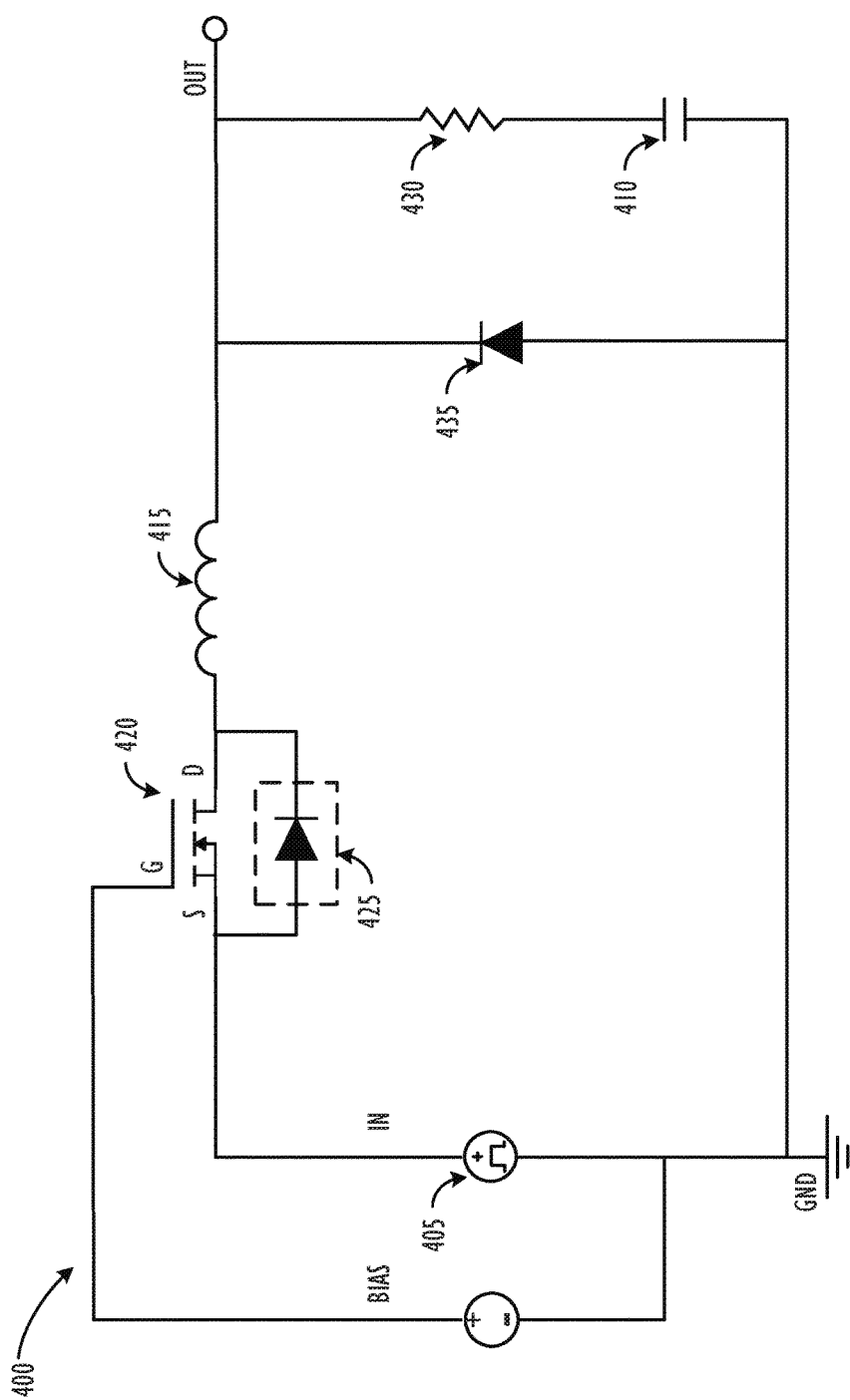
FIG. 4 is a schematic diagram illustrating exemplary gate driver 400 that includes a resonant circuit, in accordance with some embodiments.

FIG. 4 illustrates exemplary gate driver 400 using a resonant circuit in accordance with some embodiments. As shown in FIG. 4, gate driver 400 may receive an input digital signal ("IN"), represented by pulse voltage source 405, and generate an output gating signal ("OUT"). The gate of the exterior power electronic device (not shown) may be modeled as gate capacitor 430 in parallel with diode 435. Gate capacitor 430 may be connected in series with inductor 415 through a switch, e.g., nFET 420, wherein nFET 420 may be driven by a bias voltage ("BIAS"). Gate capacitor 430 and inductor 415 may form a resonant inductor-capacitor circuit.

Referring to FIG. 4, when the input digital signal is asserted high, pulse voltage source 405 may create a logic high voltage, which may turn off nFET 420. Thus, pulse voltage source 405 may charge gate capacitor 410 through inductor 415 and the body diode of nFET 420 (not shown). Alternatively, gate driver 400 may use an optional low-conduction-voltage diode, such as Schottky diode 425, connected in parallel with nFET 420 to reduce conduction losses. Following the same analysis of the inductor-capacitor resonant circuit in FIG. 3, gate capacitor 410 may create a doubled gating voltage with respect to the input digital signal. When the output gating signal reaches the boosted voltage, the body diode of nFET 420 or optional Schottky diode 425 may become reverse-biased, block a discharging current flowing through gate capacitor 410, and thus clamp the gating signal at the boosted level. In summary, when the input digital signal is high, the output gating signal may also be asserted high with a boosted value with respect to the input digital signal.

Referring back to FIG. 4, when the input digital signal is asserted low, pulse voltages source 405 may output a logic low voltage and turn on nFET 420. Thus, gate capacitor 410 may be discharged through nFET 420 and inductor 415, and accordingly the gating signal may become low as well. In other words, when the input digital signal is low, the gating signal may be asserted low as well. In discharging the gating signal through inductor 415, inductor 415 may be energized with the inductor current. Diode 435 may be needed to allow continuous conduction of the inductor current after the gating signal reaches zero volts. Diode 435 may acts as a clamp thus preventing a large negative voltage from developing on the gating signal and also allowing inductor 415 to decay its stored current.

Again, FIGS. 3 and 4 may not depict certain components, such as resistors, capacitors, inductors, and/or diodes, which are typical for power electronic devices' gate drivers. Because they are not necessarily specific to embodiments in this disclosure, they are omitted from the drawings.

In some embodiments, the above disclosed gate drivers may include a primary side and a secondary side, the two of which are isolated, for instance, by a transformer. The disclosed gate drivers, especially the circuits related to voltage boosting, may be used at either or both of the primary and secondary sides. The primary side refers to the portion of a gate driver that interfaces directly with the controller, while the secondary side designates the portion that works directly with the power electronic device. The isolation may provide a barrier to electromagnetic interference (EMI) propagation from the secondary side to the primary side, as well as further flexibility to match the different voltages.

Several exemplary voltage values are used in the above descriptions. However, it should be understood that these numerical values are for purposes of illustration only, and that other voltages (e.g., bias voltages, input digital signal voltages, and/or threshold voltages) of the devices and components may be used.

The various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A gate driver with voltage boosting capabilities for generating a gating signal at an output of the gate driver from an input signal received at an input of the gate driver, the gate driver comprising:
 a charge pump, the charge pump comprising a capacitor and a plurality of switches;
 wherein responsive to a low value of an input signal, the capacitor is bypassed by the plurality of switches as to allow the input signal to drive the output directly, and
 wherein responsive to a high value of the input signal, the capacitor is coupled in series with the input signal by the plurality of switches to drive the output with a boosted value with respect to the input signal.

2. The gate driver of claim 1, wherein
 the plurality of switches comprises at least two series-connected switches;
 the capacitor is coupled across at least one of the at least two series-connected switches;
 responsive to the low value of the input signal, the capacitor is bypassed by a first switch or a body diode of the first switch of the at least two series-connected switches; and
 responsive to the high value of the input signal, the capacitor is coupled in series with the input signal by a second switch of the at least two series-connected switches.

3. The gate driver of claim 2, further comprising a first diode, wherein
 the first diode is coupled in parallel with the first switch of the at least two series-connected switches; and
 responsive to the low value of the input signal, the capacitor is bypassed by the first diode.

4. The gate driver of claim 1, further comprising a bias voltage that is configured to charge the charge pump.

5. The gate driver of claim 1, further comprising a diode coupled in series with a bias voltage and configured to block a discharging of the charge pump responsive to the high value of the input signal.

6. The gate driver of claim 4, wherein the bias voltage is equivalent or close to a steady-state high voltage of the input signal.

7. The gate driver of claim 4, wherein the bias voltage is different from a steady-state high voltage of the input signal.

8. A method for generating a gating signal, comprising:
 receiving an input signal by a gate driver, the gate driver comprising a charge pump that includes a capacitor and a plurality of switches;
 responsive to a low value of the input signal, bypassing the capacitor of the charge pump by operating the plurality of switches so as to directly couple the input signal to an output of the gate driver; and
 responsive to a high value of the input signal, coupling the capacitor of the charge pump in series with the input signal and the output of the gate driver by operating the plurality of switches to generate the gating signal with a boosted value with respect to the input signal.

9. The method of claim 8, wherein
 the plurality of switches comprises at least two series-connected switches;
 the capacitor is coupled across at least one of the at least two series-connected switches;
 bypassing the capacitor, responsive to the low value of the input signal, comprises closing a first switch or conducting current through a body diode of the first switch of the at least two series-connected switches; and coupling the capacitor in series with the input signal, responsive to the high value of the input signal, comprises closing a second switch of the at least two series-connected switches.

10. The method of claim 9, wherein
the gate driver further comprises a first diode that is coupled in parallel with the first switch of the at least two series-connected switches; and
bypassing the capacitor, responsive to the low value of the input signal, comprises conducting current through the first diode.

11. The method of claim 8, wherein the gate driver further comprises a bias voltage that is configured to charge the charge pump.

12. The method of claim 8, wherein the gate driver further comprises a diode coupled in series with the bias voltage and configured to block a discharging of the charge pump responsive to the high value of the input signal.

13. The method of claim 11, wherein the bias voltage is equivalent or close to a steady-state high voltage of the input signal.

14. The method of claim 11, wherein the bias voltage is different from a steady-state high voltage of the input signal.

15. A gate driver with voltage boosting capabilities for generating a gating signal from an input signal, comprising:
a charge pump, the charge pump comprising at least two series-connected switches, a capacitor coupled across at least one of the at least two series-connected switches, and a first diode coupled in parallel with a first switch of the at least two series-connected switches;
wherein responsive to a low value of an input signal, the capacitor is bypassed by the plurality of switches and the first diode so as to allow the input signal to be the gating signal, and
wherein responsive to a high value of the input signal, the capacitor is coupled in series with the input signal by the plurality of switches to generate the gating signal with a boosted value with respect to the input signal.

16. The gate driver of claim 15, further comprising a bias voltage that is configured to charge the charge pump.

17. The gate driver of claim 16, further comprising a diode coupled in series with the bias voltage and configured to block a discharging of the charge pump responsive to the high value of the input signal.

18. The gate driver of claim 16, wherein the bias voltage is equivalent or close to a steady-state high voltage of the input signal.

19. The gate driver of claim 16, wherein the bias voltage is different from a steady-state high voltage of the input signal.

* * * * *